United States Patent [19]
Lin

[11] Patent Number: 6,046,934
[45] Date of Patent: Apr. 4, 2000

[54] METHOD AND DEVICE FOR MULTI-LEVEL PROGRAMMING OF A MEMORY CELL

[75] Inventor: Chin Hsi Lin, Hsinchu, Taiwan

[73] Assignee: Macronix International Co., Ltd., Hsinchu, Taiwan

[21] Appl. No.: 09/229,460

[22] Filed: Jan. 12, 1999

[51] Int. Cl.$^7$ .................................................. G11C 11/34
[52] U.S. Cl. .............................. 365/185.03; 365/185.19; 365/185.2; 365/185.21
[58] Field of Search ...................... 365/185.03, 185.19, 365/185.2, 185.21, 185.01

[56] References Cited

U.S. PATENT DOCUMENTS

| | | | |
|---|---|---|---|
| 5,042,009 | 8/1991 | Kazerounian et al. | 365/185.18 |
| 5,218,569 | 6/1993 | Banks | 365/189.01 |
| 5,293,560 | 3/1994 | Harari | 365/185.03 |
| 5,422,845 | 6/1995 | Ong | 365/185.18 |
| 5,566,111 | 10/1996 | Choi | 365/185.22 |
| 5,590,076 | 12/1996 | Haddad et al. | 365/185.25 |
| 5,712,815 | 1/1998 | Bill et al. | 365/185.03 |
| 5,768,191 | 6/1998 | Choi et al. | 365/185.22 |

*Primary Examiner*—David Nelms
*Assistant Examiner*—Hoal V. Ho
*Attorney, Agent, or Firm*—Mark A. Haynes; Haynes & Beffel LLP

[57] ABSTRACT

A method and device for programming multiple levels of voltage states in a memory cell. A program and verify memory cell device includes a memory cell coupled with at least one dummy cell, the devices sharing common drain, gate, and source nodes. The threshold voltage of each dummy cell is set to a target threshold level for programming the memory cell. A stair-step sequence of pulses is used to program and verify the memory cell. A constant current source can also be coupled between the source node and the ground. The programming steps for this device include applying a high voltage to the drain and gate nodes, and coupling the source to level while starting the program pulse, then establishing a constant current at the source to pull it from high to level, and then applying program and verify pulses at the memory cell gate. A self convergence memory cell device includes the parallel connected memory and dummy cells above, but with at least one current sensing device coupled between the dummy cell and the drain. The programming steps for this device include applying a high voltage to the drain and gate nodes, and coupling the source to level while starting the program pulse, then establishing a constant current at the source to pull it from high to level, and then using the current sensing device to pull down the drain when a certain dummy cell current is reached upon subsequent application of programming pulses.

19 Claims, 9 Drawing Sheets

METHOD AND DEVICE FOR MULTI-LEVEL PROGRAMMING OF A MEMORY CELL

BACKGROUND OF THE INVENTION

1. Field of the Invention

The present invention relates to memory cell devices, and more particularly to multi-level threshold programming method for such devices so that precise charge placement is achieved with no, or minimal, overshoot of the threshold voltage, and relatively small device overhead requirements.

2. Description of Related Art

Multi-level threshold programming of memory cells and then like is being used by many developers to increase the amount of data which can be stored in a memory device. For instance, instead of two threshold states being used to store "on" or "off" data levels in the memory cell, a larger number of threshold states are now being used and sensed as separate data levels. This allows for an increased data storage for a given amount of memory.

In order to achieve multi-level threshold programming of such memory cells, a precise charge placement is one of the main requirements. In particular, it is important to program the memory device so that no significant overshoot of the threshold voltage occurs, as overshoot might be erroneously interpreted as a subsequent data level by the sensing device. As the precision of the charge placement is increased, then significantly more voltage levels might be used with a single memory cell, thereby increasing the relative density of data storage.

Many prior arrangements and programming techniques have been proposed for multi-level threshold programming of memory cells. One such technique involves the steps of programming the memory cell and then verifying the programmed level thereafter (referred to as "program and verify"). Variations of the program and verify technique are disclosed in U.S. Pat. Nos. 5,293,560 and 5,218,569. Yet another technique involves self-convergence, wherein the desired programmed voltage level will be established by using current or voltage sensing at some point in the device to cease further programming of the device. This eliminates the need for verification of each programmed level. Examples of such self-convergence techniques are disclosed in U.S. Pat. Nos. 5,566,111 and 5,712,815.

One problem which occurs with both such techniques is that during programming, while a programmed condition is approaching a desired level, the threshold voltage of the programmed cell is shifted in coarse and uneven increments from a low level to a high level, or vice versa. This will generally cause the threshold voltage distribution to be relatively wider than desired for multi-level cell programming. Some solutions to this problem include the following: using a controlled pulse width for the gate voltage program pulse; using a smaller voltage step for each subsequent program pulse applied to the gate; and/or using more accurate reference voltage comparators. Each of these solutions involves tradeoffs in device cost and programming speed.

Still another factor which will influence the programming and establishment of working multi-level threshold voltages in a memory cell is the series resistance effect as described in U.S. Pat. No. 5,422,845. This patent proposes the solution of adding one or more resistors between the ground contact and the ground. The result of such a solution is a significant increase in device overhead as resistors generally require a large area for formation on semiconductor layouts.

Hence, it is desirable to provide a memory cell device arrangement and programming method which will provide desirably narrow distribution of multi-level threshold voltages, but without requiring costly and precise control of the gate programming pulse width and/or voltage step, or additionally require increased use of peripheral device such as comparators, resistors, and the like.

SUMMARY OF THE INVENTION

According to the present invention, a memory device includes a dummy cell coupled in parallel to a selected memory cell, thereby forming common source and drain nodes. The reference to a parallel connection is a simplified representation, as the devices are coupled through appropriate block, column and row select circuits and the like which are commonly known in the art. The gates of the coupled devices also share a common wordline and form a gate node. The threshold voltage of the dummy cell is set, or the appropriate dummy cell is selected, respective to the desired target threshold voltage of the programmed memory device. The current through the associated dummy cell is used to control the overshoot of the programmed threshold voltage of the memory cell. A series of step voltages, or program pulses, are applied to the gate of the memory cell in order to achieve the programmed threshold voltage.

In another aspect of the invention, a constant current source comprised, for instance, from a transistor device is used between the common source node and the ground connection of the dummy and memory cell devices. Programming steps include timing the application of a known voltage to the current source transistor gate to produce a constant current at the source node. A program and verify method of programming the memory cell utilizes the parallel connected devices according to the following steps: Coupling the drain node and gate node to a high voltage, and coupling the source node to an intermediate level at the current source while the programming pulse starts; Thereafter, the gate of the constant current source is connected to a fixed voltage level from ground which turns on the current source and pulls the source node to the current source level. Initially, the current through the memory cell equals the current through the current source, with the dummy cell current being zero, as the threshold voltage of the memory cell is less than that of the dummy cell; In its final state, the memory cell current equals the dummy cell current which equals half the constant current, provided that the aspect ratio of the memory cell and the dummy cell are equivalent, and their threshold voltages are approximately the same. This aspect of the invention provides convenient programmability, yet significantly reduces the overshoot of the threshold voltage, thereby providing improved threshold voltage distribution.

According to another aspect of the present invention, a self-convergence method utilizes the coupled memory and dummy cell devices along with sensing amplifier devices and drain pull-down devices which are activated by current flowing through the dummy cell. The programming steps include the following: Coupling the drain and gate nodes to high voltage, and the source node to an intermediate level at the start of programming; Thereafter coupling the gate of the current source to a known level from ground, which turns the current source on and pulls the source node to high from the intermediate level; and Monitoring the dummy cell current via the sensing amplifier devices which turn on the drain pull-down devices when the dummy cell current reaches a certain level. This stops the programming of the memory cell when the desired programming threshold voltage across the cell is reached. This convergence method with the dummy cells reduces the width of the current distribution for each threshold voltage while the threshold voltage is converged to one value, as the memory cell current is determined by the sensing amplifier. Moreover, a series of dummy cells and associated sense amplifiers can be used for each subsequent target threshold voltage, thereby creating multiple data levels for any one memory cell which might be switchably connected to the series of dummy cells.

Other aspects and advantages of the present invention can be seen upon review of the figures, the detailed description and the claims which follow.

DETAILED DESCRIPTION

Figure 7:
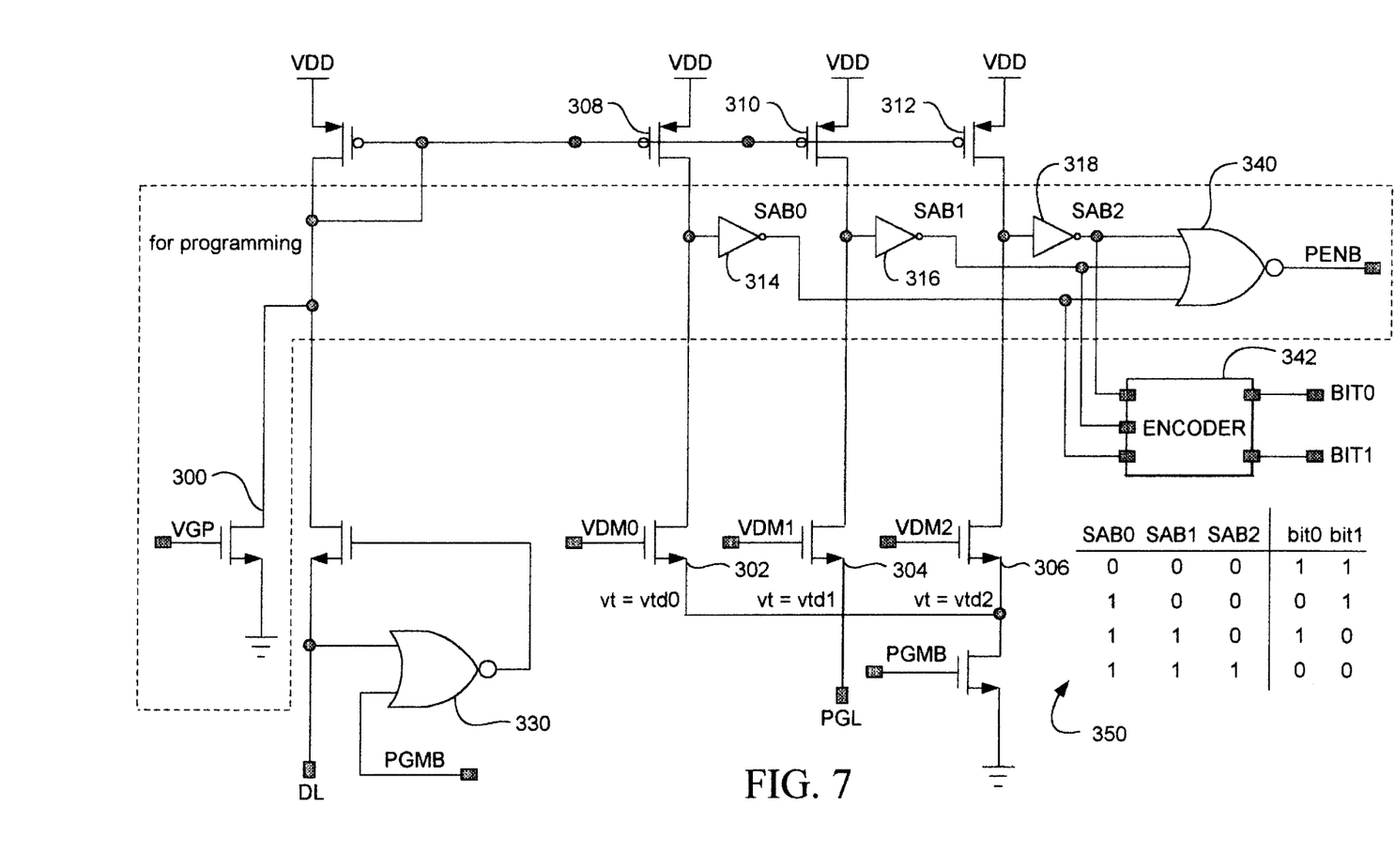
FIG. 7 is a diagram of a sense amplifier circuit of FIG. 6, including a representative set of three dummy cells for achieving 4 programming levels.
Figure 8:
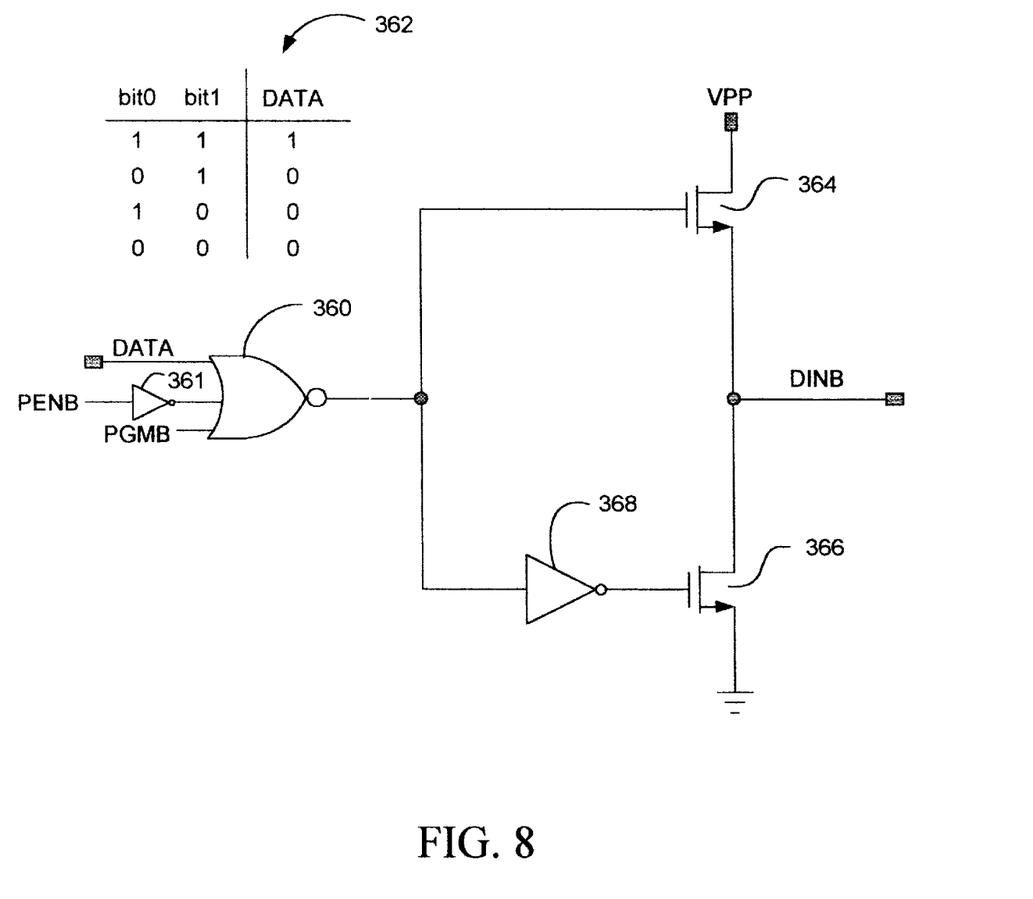
FIG. 8 is a diagram of an example data input buffer which is used for mapping write-in-data to the drain node of the memory cell.

A detailed description of the present invention is provided with respect to FIGS. 1–8. The devices coupled as shown in FIGS. 1–5 are for representative purposes, and serve to simplify the discussion by excluding certain switching networks and the like. FIGS. 6–8 show representative switching arrangements and peripheral circuits for a memory cell array. It is intended that the principles described below can be applied to other memory cells devices, arrays, and the like, to achieve the beneficial results disclosed.

Figure 1:
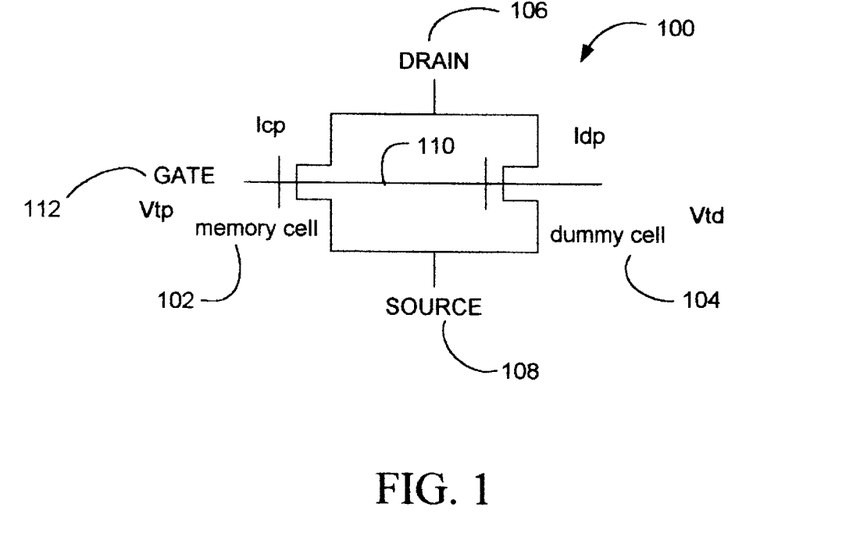
FIG. 1 a circuit diagram of the base configuration of the present invention, the circuit including a dummy cell connected in parallel with the memory cell to be programmed. Note that for FIGS. 1, 3 and 4 the parallel connections shown are a representative examples to facilitate description of the invention. Cell array layouts, switching connections, and the like have been omitted for simplicity.

In FIG. 1, a representative programmable memory cell arrangement 100 is shown. This includes a memory cell 102 connected in parallel with a dummy cell 104. As connected, a common drain node 106 is formed along with a common source node 108. A common line 110 (i.e. a wordline) ties the gates of the cells into a gate node 112. The threshold voltage of the programmed memory cell device 102 is shown as Vtp and its current as Icp. The respective values for the dummy cell device 104 are shown as Vtd and Idp.

According to this configuration, Vtd of the dummy cell is set respective to the target threshold voltage (hence referred to as Vt). For example, if two data bits are desired from one cell, then at least 4 detectable threshold levels will be needed within the device (e.g zero plus three other levels). As such the target programmed Vt might be switchably set to 4 different levels via connection with a set of dummy cells, each dummy cell having a different threshold voltage Vtd. A switchably accessible set of such dummy cells would be made available with as many target thresholds as needed for a particular data storage density.

Figure 2:
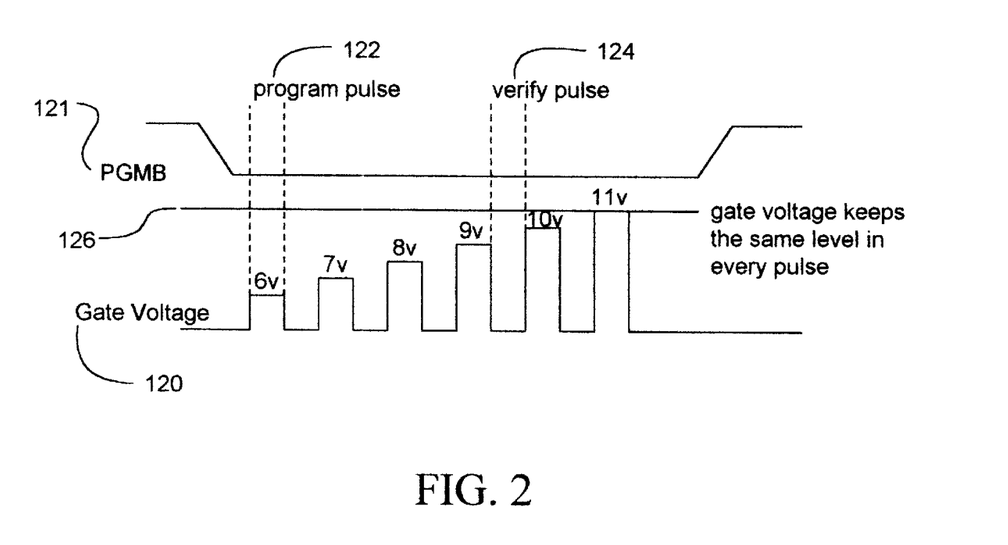
FIG. 2 is a graph illustrating the larger gate voltage steps and pulse widths (relative to prior techniques) which are possible with the present invention without adversely affecting/threshold voltage distribution.

In FIG. 1, with the dummy cell 104 coupled to the memory cell 102 as representatively shown, a stair-step application of gate voltages generally provides an advantageous programming mode. Referring also to FIG. 2, a graph is shown of the programming gate voltages 120 to be applied to the gate node 112. The program enable signal is shown as PGMB 121. Initially, the dummy cell 104 does not share a significant amount of drain current with the memory cell 102. As the threshold voltage of the programmed memory cell approaches a target level voltage (Vt), there is more current flowing through the dummy cell. Compared to prior systems, the program pulse width 122 and program verify pulse 124 do not have to be as tightly controlled. Additionally, the voltage step increases can be varied in greater steps (e.g. around 1 volt for each step), rather than smaller steps which can lead to more program and verify operations. Prior methods might need to apply approximately 10 or more program and verify steps, whereas the present method would need fewer because of the larger voltage steps. For instance, the present method might need only five steps to program the cell. Moreover, by using larger voltage steps with the present invention, any variations of the gate voltage will have little influence on the threshold voltage distribution. In FIG. 2, line 126 (shown passing through 11 volts) indicates that the gate voltage 120 will generally stay at the same level during each subsequent program pulse.

Figure 3:
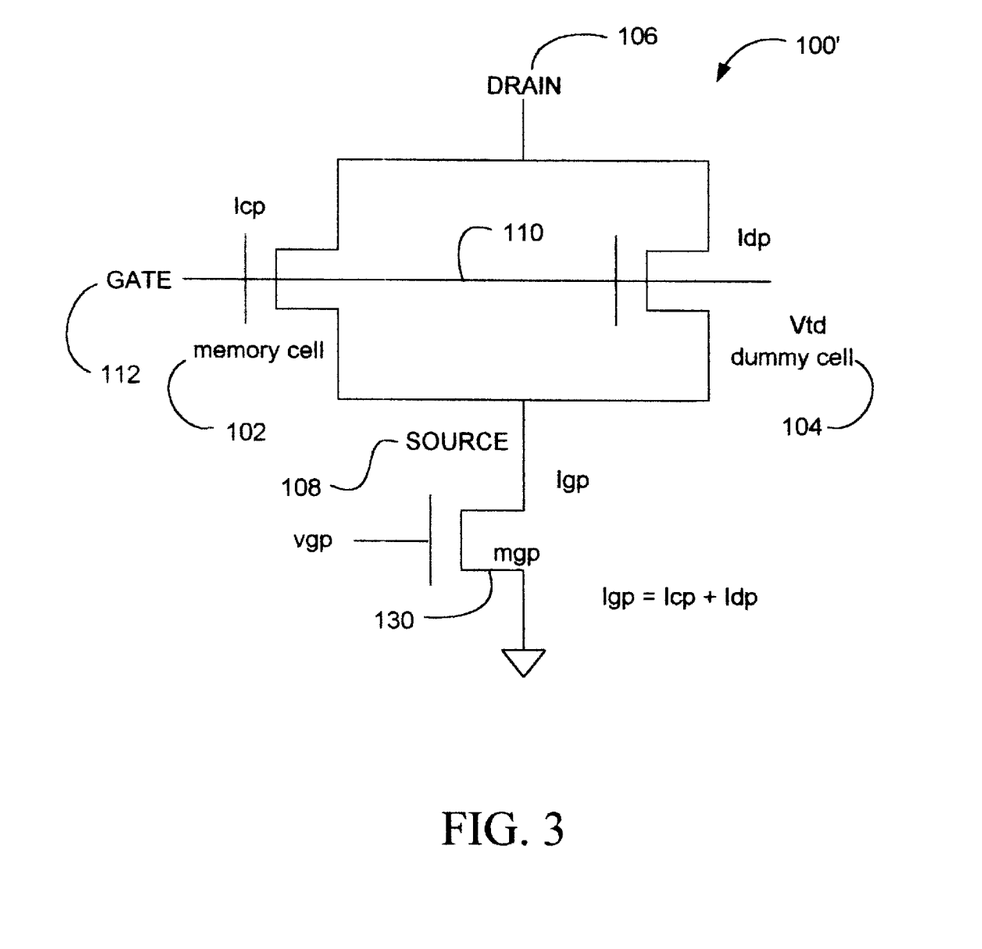
FIG. 3 is a circuit diagram of another embodiment of the present invention for practicing the program and verify method, the circuit including a dummy cell connected in parallel with the memory cell to be programmed, and a constant current source between the common source node and ground.

FIG. 3 shows a representative memory device 100' comprised of the memory device 100 of FIG. 1, but with the addition of a constant current source mgp formed from a transistor device 130. The current source 130 might be comprised of similar devices which provide a current sourcing function. The source 130 is placed between the source node 108 and the ground level (0 volts). For the transistor device, a known voltage vgp is applied to the gate, and a constant current Igp is produced to pull down the source node 108.

Given this memory cell arrangement 100', a program and verify method of programming can be applied to provide improved multi-level threshold voltage distribution. Before programming is applied, Igp is pre-defined by applying an known vgp to the gate of device 130. Vgp can be tracked with a mini-array or the like to compensate for process variations. To program the device, the drain node 106 and gate node 112 are coupled to high voltage, and the node source is also coupled to a certain intermediate level while the program pulse starts. Thereafter, the gate of mgp is coupled to a known vgp level from ground (0 volts). During these initial steps, Icp=Igp, and Idp=0. Further, it is assumed that Vtp is smaller than Vtd, wherein Vtd is set respective to the target voltage Vt. Note that if Vtp is larger than Vtd, then Idp is not equal to 0, and the program action will be terminated, or deemed inefficient with such device values. In time, the dummy cell current increases and Icp=Idp=Igp/2, provided the aspect ratio of the memory cell and the dummy cell are equivalent, and Vtd has been set or configured to equal the target voltage Vt. With this device configuration and programming method, the programming remains relatively simple, but the overshoot of Vtp is reduced, thereby providing improved threshold voltage distribution.

Figure 4:
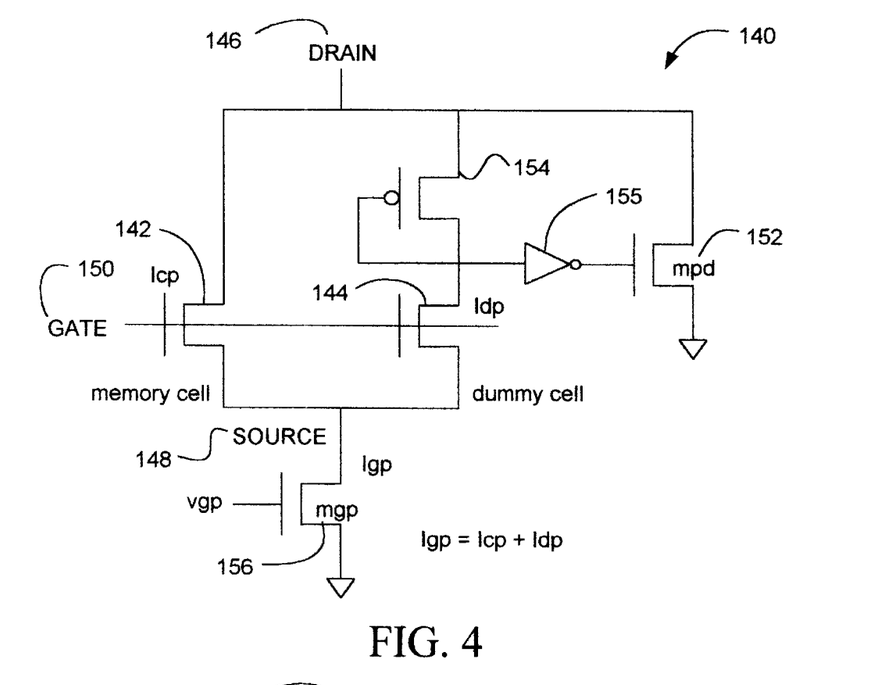
FIG. 4 is a circuit diagram of another embodiment of the present invention for practicing the self-convergence method, the circuit further including read cells and pull-down cells in addition to the devices of FIG. 1.
Figure 5:
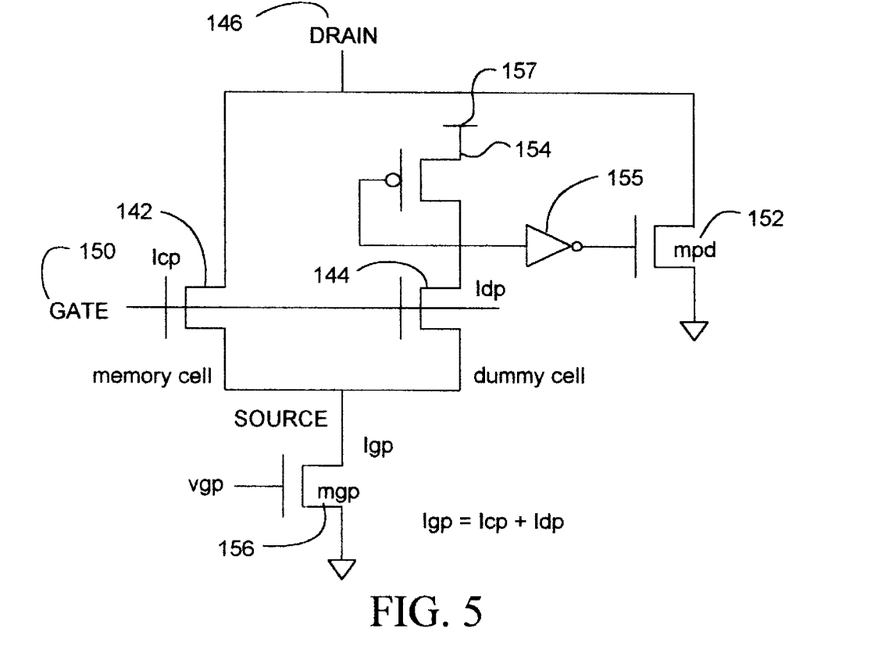
FIG. 5 is a circuit diagram of still another embodiment of the present invention with a variation of the device drain connections shown in FIG. 4.
Figure 6A:
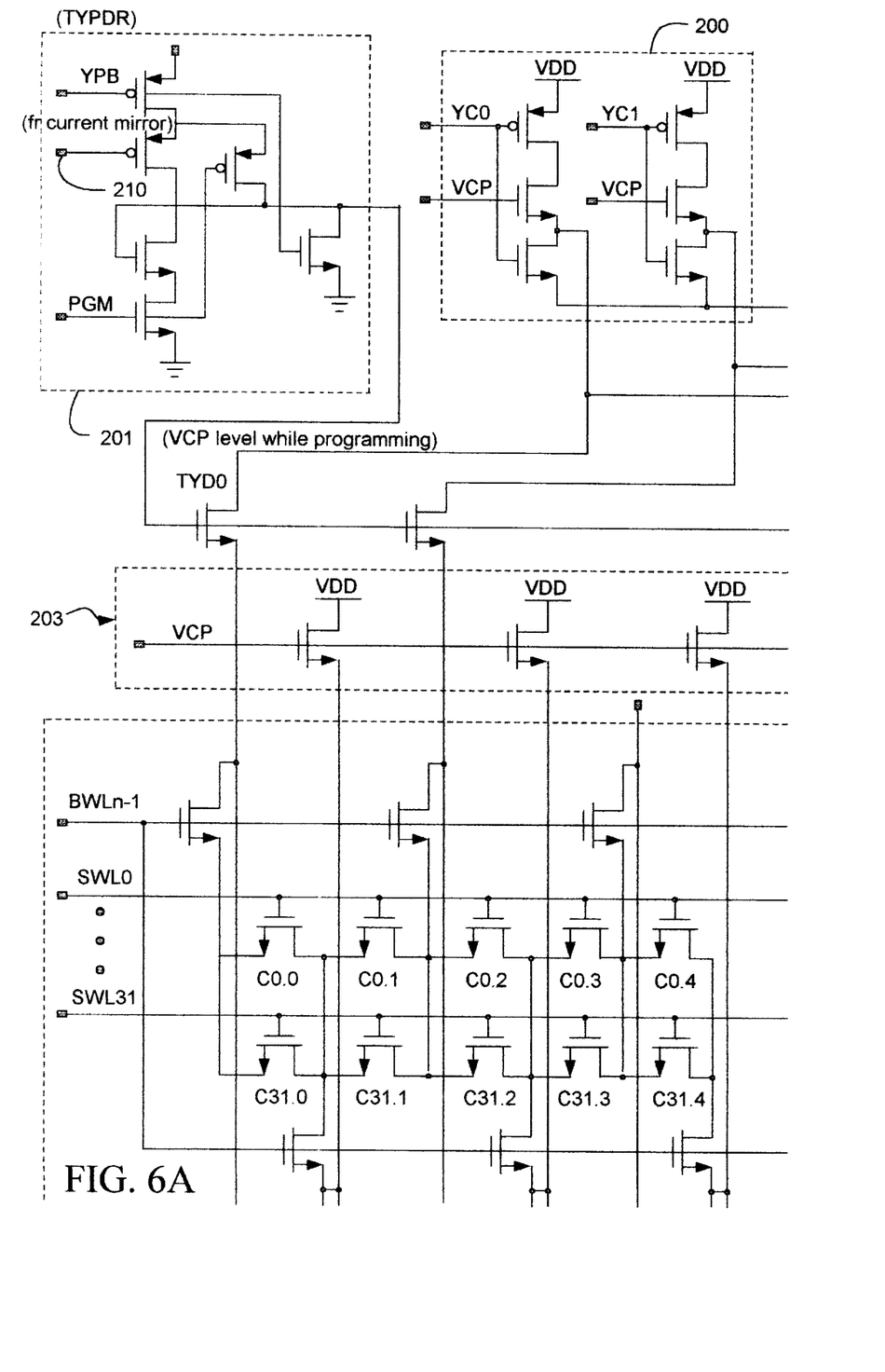
FIG. 6 a diagram of a memory cell array wherein individual memory cells can be selectively programmed according the representative Figures above.
Figure 6B:
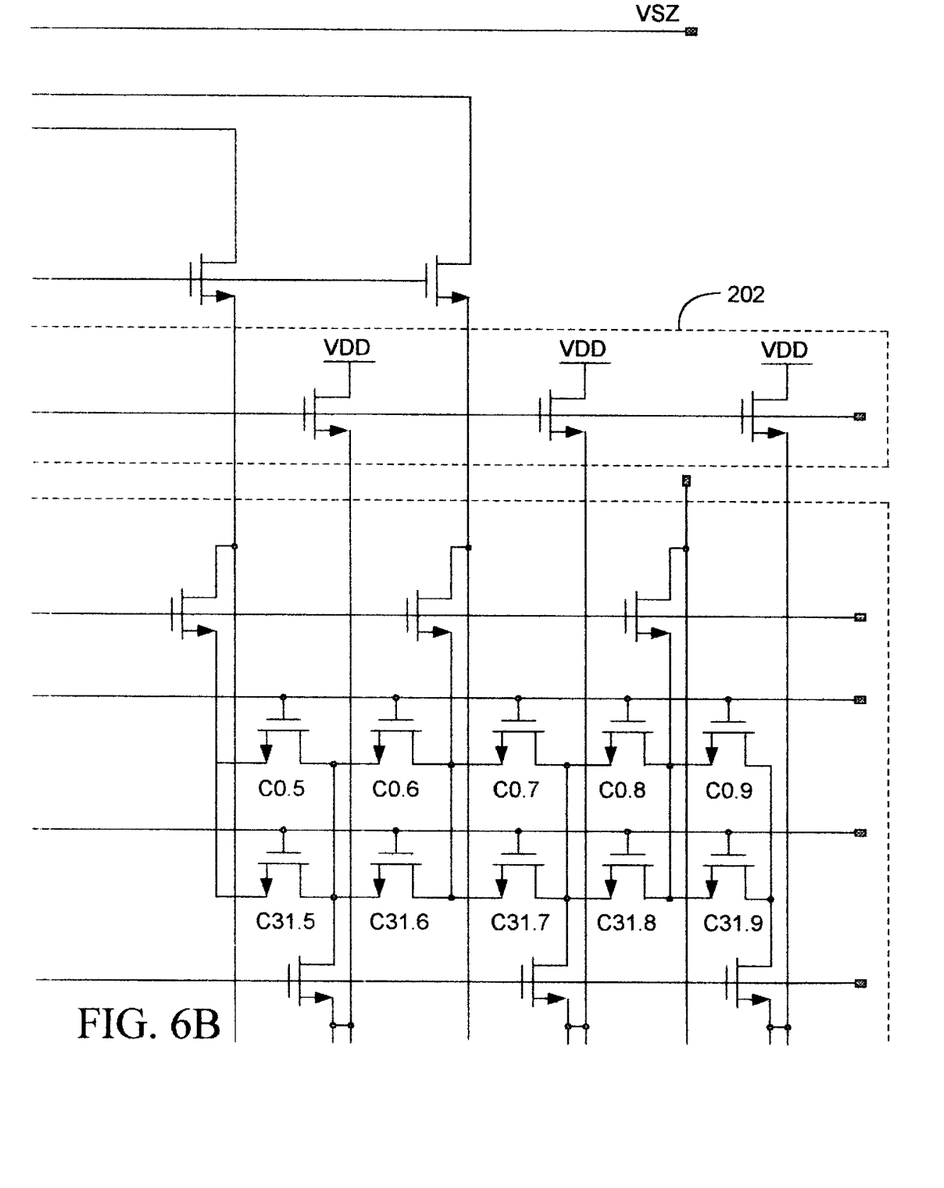
Figure 6C:
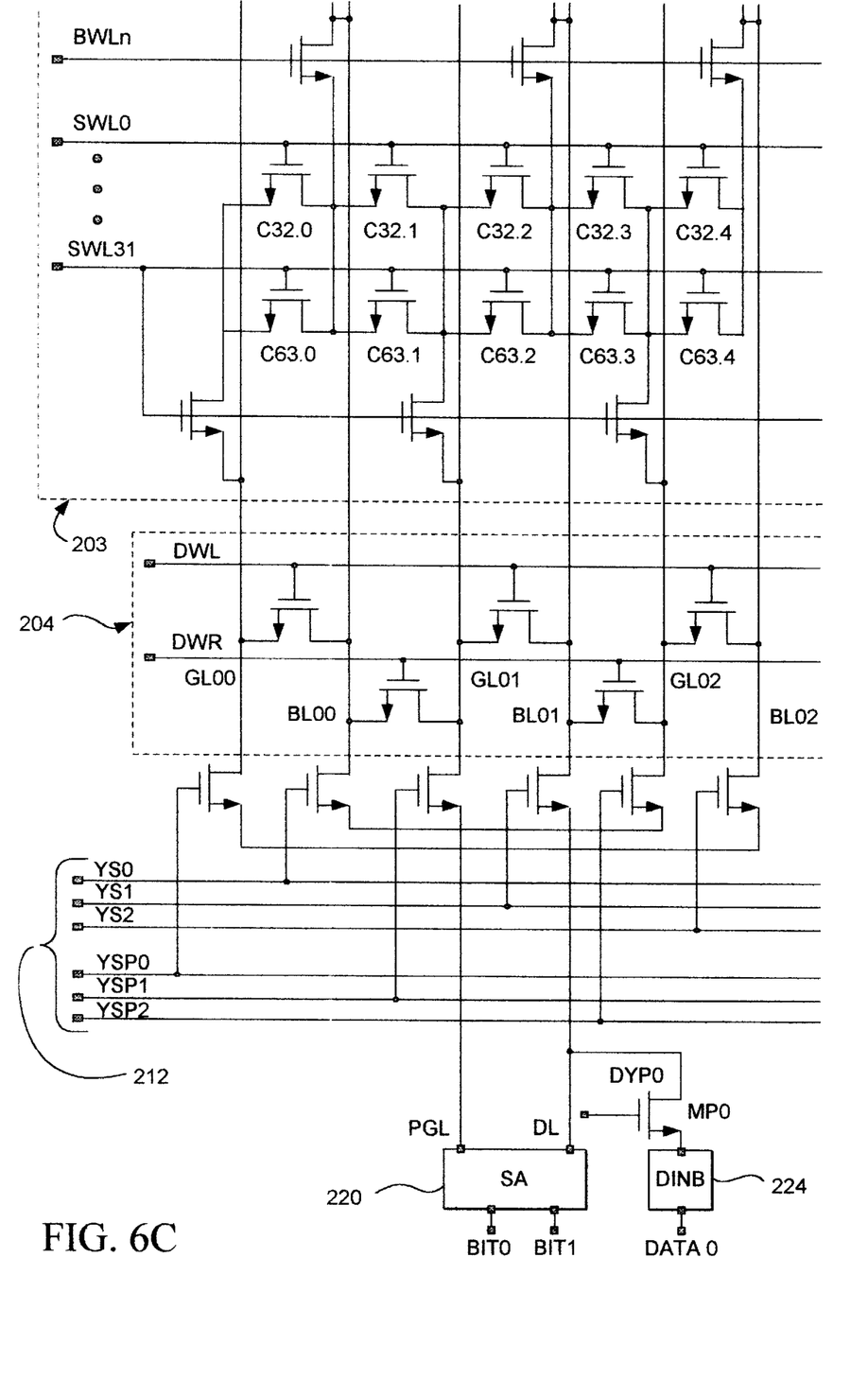
Figure 6D:
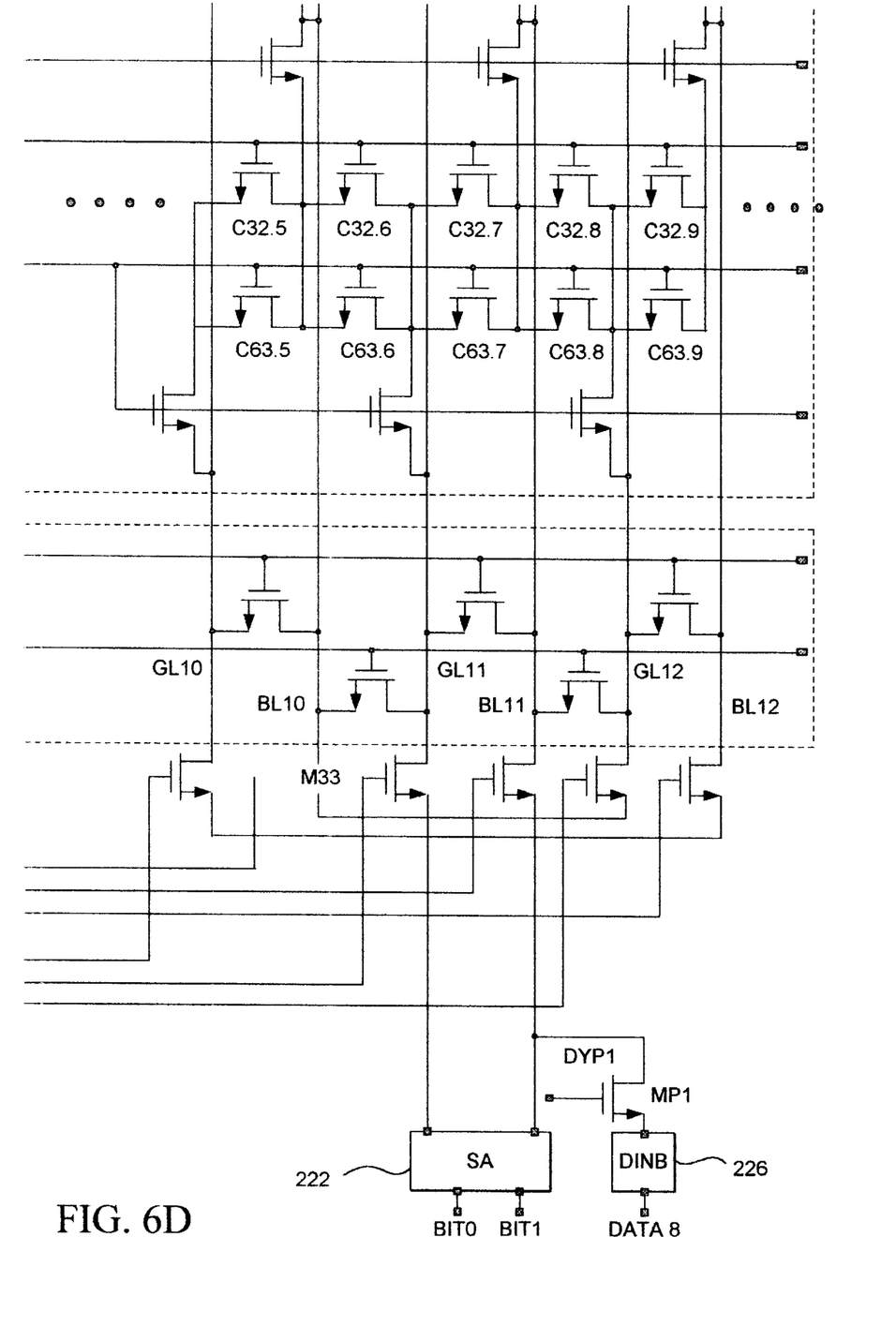

FIG. 4 shows a similar representative arrangement to that of FIG. 3, but with added components to achieve self-convergence of the programming level. The memory cell arrangement 140 includes a memory cell 142 with current Icp arranged in parallel with a dummy cell 144 with current Idp. A constant current source 156 with current Igp is coupled between the source node 148 and the ground. A sense amplifier is shown which includes a current reading device 154 coupled to an inverter 155, along with a pull-down device 152. These device are used together to sense the current Idp and pull down the drain when the current reaches a certain level. This level will correspond with the target threshold voltage being reached on the programmed memory cell. A common drain node 146 is formed for the devices 142, 152, and 154. A common gate node and source node are formed for the devices 142 and 144. FIG. 5 shows a device similar to that shown in FIG. 4, except the drain 155 of the device 154 is connected separate from the common drain 146, and is thereby connected to an independent supply.

The self-convergence programming method involves steps similar to the program and verify operation above. Prior to programming, the drain node 146 and the gate node 150 are coupled to high voltage, and the source node 148 is coupled to a certain intermediate level while the program operation starts. Thereafter the gate of the current source device 152 is coupled to vgp from ground level (0 volts). This turns Igp on and pulls the source node 148 from high to level. A sense amplifier, which includes a reading cell 154 coupled to an inverter 155, is used to sense the dummy cell current Idp, which in turn provides an indication of the programming cell current as Icp equals Igp minus Idp. When Idp reaches a certain level, the reading cell 154 will turn on and facilitate pulling down the drain voltage and establishing the programmed state of the memory cell 142.

Referring now to FIG. 6 is a circuit diagram illustrating the internal structure of an array of floating gate memory cells in accordance with an aspect of the present invention. The array includes a plurality of floating gate memory cells arranged for selectable programming in block 203. The floating gate memory cells are coupled source to drain to form rows of floating gate memory cells. Control gates of all floating gate memory cells in a row are coupled to the same wordline. Example block selection lines BWLn-1 and BWLn are shown along with their respective memory cell wordlines SWL0 through SWL31. Block 204 shows column select lines and circuitry, as controlled by inputs DWL and DWR, which serve to selectively couple bit lines to appropriate adjacent bit lines lines. Block 202 shows related circuitry which ties selected bits lines, via input signal VCP, to appropriate voltage levels (e.g. 2.0 volts while VDD=6.25 volts) for programming the memory cells. Block 201 shows an example current limiter which provides a controlled level TYPO (or VGP) using the control signals PGM, YPB and a signal from a current mirror 210. A driver block 200 is shown which utilizes input signals VGP, YG0, and YG1. Bit select lines 212, individually labeled asYSO-YS2, and YSP0-YSP2, emanate from a decoder circuit which selects the desired bit lines. The operation of a similar memory cell array is described in further detail in co-pending U.S. patent application entitled "Apparatus and Method for Programming Virtual Ground EPROM Array Cell Without Disturbing Adjacent Cells," with inventors Chin-Hsi Lin, Shi-Chamg Al, Chien-Sing Lee, Ful-Long Ni, Mam-Tsung Wang, Chin-Yi Huang, filed Aug. 26, 1997, as U.S. Application Ser. No. 08/918,796, the application hereby incorporated by reference as is fully set forth herein. A sense amplifier 220 is also shown which corresponds to data bit 0, and a sense amplifier 222 is shown which corresponds to data bit 8. A respective data input buffer 224 for data0 and buffer 226 for data8 is also shown coupled to a respective dataline DL.

Referring also now to FIG. 7, a detailed illustration of the sense amplifier referred to in FIG. 6 is shown (with buffers 220 and 222 being generally the same in principle of operation). In this example, a selected memory cell, through dataline DL, is coupled to one of the dummy cells 302, 304, and 306, depending upon the write-in data. In other words, one of the devices 302, 304, or 306 will be enabled, depending upon the write-in data over DL, while programming. NMOS device 300 is used to stimulate the partial programming current and is driven by VGP. Each dummy cell 302–306 has a different threshold voltage, respectively labeled as vtd0, vtd1, and vtd2. Each dummy cell has coupled to it an individual sensing amplifier. The sensing amplifiers are comprised of a transistor coupled to an inverter as shown, respectively labeled as 308–312, and 314–316. The output signals SAB0, SAB1, and SAB2 from the sense amplifiers are fed into a NOR gate 340 to produce a program enable bar (PENB) signal, while programming. While reading, this path will be disabled. The output signals are also fed into an encoder 342 to produce 2 data bits (bit0 and bit1), which when used together will form 4 distinct data levels, while reading. This path will be disabled during programming. In the proposed application, it is desired to have the converged threshold voltage of the programmed cell be traced by the sense amplifier, while reading. Accordingly, the dummy cells are used both in programming and read operations. While reading, the dummy cells will be compared with a memory cell coupled to the dataline DL, the gate 330 will be enabled, and PGMB will be coupled to high. The NMOS device 300 will be disabled, as VGP is coupled low while reading. While programming, the dummy cells will be compared with the defined partial programming current which is defined by NMOS device 300, as driven by VGP. The path of the dataline will be disabled by PGMB being coupled low. As the sense amplifier will be used for both program and read operations, the respective outputs become PENB, BIT0, and BIT1. Table 350 shows the relationship of the levels of SAB0, SAB1, and SAB2 to the encoder 342 outputs BIT0 and BIT1, which are the outputs of the multi-level cell after sensing.

Referring now to FIG. 8, the data input buffer from FIG. 6 (224, 226) is shown which couples the signal DINB into the DL (from FIG. 7). Table 362 shows a DATA signal which is a decoded signal resulting from write-in data bits (bit0 and bit1—as different from BIT0 and BIT1 discussed above) used while programming. This DATA signal along, with the previously discussed PENB signal, and the PGMB signal (through an inverter 361), are fed into a NOR gate 360. The buffer further includes transistor devices 364, 366, and inverter 368 connected as a divider network between supply VPP and ground to provide the data input signal DINB. According to this arrangement, the DATA signal will only be applied to the dataline input DL when just one sense amplifier has detected a desired memory cell program level. While programming, the circuit will be enabled (via PGMB), and the DINB signal level is related to the DATA level. While DATA=1, DINB is at a low level, and when DATA=0, DINB is high. While reading, the circuitry is disabled, with DINB being kept low. Note that while example figures were shown which described the components used for producing 4 program levels (e.g. 2 bits), a similar connection of components could be used to achieve even more program levels.

In the demonstrated configurations, achieving an improved threshold voltage or current distribution is an important factor in providing a multi-level memory cell device. However, this should not come at the price of unreasonable device overhead to control or counter the following: pulse widths; series resistance effects; or process variations. The present invention, with the coupled dummy cell having a threshold voltage equal to the programming target level, along the aforementioned methods of programming, provides an efficient solution to control the programmed threshold voltage and compensate for any variations.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. A program and verify method for programming a multi-level threshold memory cell device via controlled regulation of the gate voltage, the device including a floating gate memory cell having a cell current and threshold voltage, the memory cell switchably coupled with at least one dummy cell having a respective cell current and threshold voltage, the threshold voltage of the dummy cell being set to a target threshold level of the memory cell, the cells having common drain, gate, and source nodes, the method comprising the steps of:
coupling the drain and gate nodes to a high voltage level, and the source node to a certain intermediate voltage level, for each of a series of program pulses applied;
repeating the application of the program pulses, and thereafter verify voltage pulses, to the gate, drain, and source nodes until the programmable threshold voltage level of the memory cell reaches the target threshold voltage.

2. The program and verify method for programming a multi-level threshold memory cell device according to claim 1, which further includes a step of switchably selecting the dummy cell for the particular target threshold voltage desired on the memory cell.

3. The program and verify method for programming a multi-level threshold memory cell device according to claim 1, wherein the step of applying voltage pulses uses stepped voltage levels coupled to the gate node for each subsequent pulse.

4. The program and verify method for programming a multi-level threshold memory cell device according to claim 3, wherein a large voltage step for gate voltage is used and thereby fewer program and apply steps are needed to program the memory cell.

5. A program and verify method for programming a multi-level threshold memory cell device including a floating gate memory cell having a respective cell current and threshold voltage, the threshold voltage of the dummy cell being set to a target threshold level of the memory cell, the memory cell switchably coupled with a dummy cell having a respective cell current and threshold voltage, the cells having common drain, gate, and source nodes, and a constant current source transistor device coupled between the source node and ground level, the method comprising the steps of:
for each of a series of program pulses,
determining a gate voltage to provide a known current through the constant current source;
coupling the drain and gate nodes to a high voltage level, and the source node to a certain intermediate voltage level, while a program pulse is applied to the gate node;
coupling the gate of the current source to the determined gate voltage to produce a constant current and pull the source node from high to level, wherein the initial memory cell current equals the current source current, and the dummy cell current equals zero, with the memory cell threshold voltage smaller than the dummy cell threshold voltage; and
applying the program pulses, and thereafter applying verify voltage pulses, until the programmable threshold voltage level of the memory cell reaches the target threshold voltage, wherein the memory cell current equals the dummy cell current which equals one half the current source current.

6. The program and verify method for programming a multi-level threshold memory cell device according to claim 5, which further includes a step of switchably selecting the dummy cell for the particular target threshold voltage desired on the memory cell.

7. The program and verify method for programming a multi-level threshold memory cell device according to claim 5, wherein the step of determining a gate voltage includes a means for tracking and compensating the gate voltage used to generate the current source current.

8. The program and verify method for programming a multi-level threshold memory cell device according to claim 7, wherein the means for tracking and compensating the gate voltage includes a mini-array in the device.

9. The program and verify method for programming a multi-level threshold memory cell device according to claim 5, wherein the step of applying voltage pulses uses stepped voltage levels applied to the gate node for each subsequent program pulse.

10. The program and verify method for programming a multi-level threshold memory cell device according to claim 9, wherein a large voltage step for the gate voltage is used and thereby fewer program and apply steps are needed to program the memory cell.

11. A self convergence method for programming a multi-level threshold memory cell device including a memory cell having a cell current and threshold voltage, the memory cell coupled with at least one dummy cell having a respective cell current and threshold voltage, the threshold voltage of the dummy cell being set to a target threshold level of the memory cell, at least one current sensing device coupled to sense the at least one dummy cell current, with the memory cell and at least one dummy cell having common gate and source nodes, and the memory cell and at least one sensing device having a common drain node, and a constant current source transistor device coupled between the source node and ground level, the method comprising the steps of:
determining a gate voltage to provide a known current through the constant current source;
coupling the drain and gate nodes to a high voltage level, and the source node to a certain fixed voltage level, while a starting program pulse is applied to the gate node;
coupling the gate of the current source to the determined gate voltage to produce a constant current and pull the source node from high to a low level, wherein the initial memory cell current equals the current source current;

applying program voltage pulses while sensing the dummy cell current with the sensing device, with the memory cell current being equal to the current source current minus the dummy cell current;

pulling down the drain via the sensing device when the dummy cell current converges upon a certain level.

12. The self convergence method for programming a multi-level threshold memory cell device according to claim 11, which further includes a step of switchably selecting the dummy cell for the particular target threshold voltage desired on the memory cell, as determined by write-in data while programming.

13. The self-convergence method for programming a multi-level threshold memory cell device according to claim 12, wherein the dummy cell includes a plurality of cells arranged with different threshold voltage levels, and a plurality of current sensing devices for sensing the current through each dummy cell.

14. The self-convergence method for programming a multi-level threshold memory cell device according to claim 13, wherein the pull down step will occur for each current sensor when the programmed voltage crosses the target threshold level set for the dummy cell.

15. The self convergence method for programming a multi-level threshold memory cell device according to claim 11, wherein the step of determining a gate voltage includes a means for tracking and compensating the gate voltage used to generate the current source current.

16. The self convergence method for programming a multi-level threshold memory cell device according to claim 15, wherein the means for tracking and compensating the gate voltage includes a mini-array in the device.

17. A circuit for utilizing a program and verify method for programming a multi-level threshold memory cell device to a target threshold voltage level, the circuit, comprising:

a memory cell having a cell current and threshold voltage;

at least one dummy cell switchably coupled with the memory cell, the dummy cell having a respective cell current and threshold voltage, the threshold voltage being set to the target threshold voltage level, the connected cells having common drain, gate, and source nodes.

18. The circuit for utilizing a program and verify method for programming a multi-level threshold memory cell device according to claim 17, which further includes a constant current source coupled between the source node and ground level.

19. The circuit device according to claim 17, which can be utilized for a self-convergence method for programming a multi-level threshold memory cell device, the circuit further including at least one current sensing device coupled to sense the at least one dummy cell current and configured so as to pull down the drain when the memory cell current reaches a desired level.

* * * * *